United States Patent
Shin et al.

(10) Patent No.: US 7,452,830 B2
(45) Date of Patent: Nov. 18, 2008

(54) SEMICONDUCTOR DEVICES AND METHODS FOR MANUFACTURING THE SAME

(75) Inventors: Chul-Ho Shin, Bucheon-si (KR); Tae-Hong Kim, Incheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 343 days.

(21) Appl. No.: 11/191,182

(22) Filed: Jul. 27, 2005

(65) Prior Publication Data

US 2006/0022284 A1    Feb. 2, 2006

(30) Foreign Application Priority Data

Jul. 28, 2004    (KR) .................. 10-2004-0059206

(51) Int. Cl.
*H01L 29/94* (2006.01)
*H01L 21/31* (2006.01)

(52) U.S. Cl. .................. 438/791; 438/786; 438/787; 257/E21.293

(58) Field of Classification Search ................ 438/786, 438/787, 791
See application file for complete search history.

(56) References Cited

U.S. PATENT DOCUMENTS

| 6,495,476 B1 * | 12/2002 | Lee et al. ................. 438/775 |
| 2005/0164444 A1 * | 7/2005 | Burnham et al. ........... 438/232 |

* cited by examiner

*Primary Examiner*—Alexander G Ghyka
(74) *Attorney, Agent, or Firm*—Andrew D. Fortney

(57) ABSTRACT

Semiconductor devices and methods for manufacturing the same are disclosed. An example method includes loading a first substrate to be provided with an oxynitride layer along with a second substrate having a nitride layer in a boat, and forming the oxynitride layer on the first substrate by placing the boat into a furnace and thermally treating the boat under an oxygen atmosphere.

17 Claims, 2 Drawing Sheets

US 7,452,830 B2

SEMICONDUCTOR DEVICES AND METHODS FOR MANUFACTURING THE SAME

FIELD OF THE DISCLOSURE

The present disclosure relates generally to semiconductor devices and semiconductor fabrication, and, more particularly, to semiconductor devices having a dual gate structure and methods for manufacturing the same.

BACKGROUND

As various semiconductor devices have been developed, their characteristics have evolved as well. For example, a logic circuit or a central processing unit (CPU) should have a dynamic random access memory (DRAM) and a static random access memory (SRAM) merged together.

When these memory devices are merged, gate oxide layers with different thicknesses must be formed on one chip so as to preserve the respective characteristics of the devices. Also, even when these devices are used without being merged together, gate oxide layers with different thicknesses must still be formed on one chip to enable operation at different operating voltages.

Such gate oxide layers are thermal oxide layers. Such layers have become thinner in accordance with the development of the design rules. However, when a gate insulating layer is formed by implanting boron as a P-type impurity into a $SiO_2$ substrate so as to form a P-type gate structure, boron penetration occurs due to the thinness of the gate oxide layer. The boron penetration degrades the characteristics of the thin film transistors (TFTs) by varying the threshold voltage.

In order to prevent the boron implanted into the $SiO_2$ substrate from penetrating a channel region, an oxynitride layer (also called a nitrided oxide layer) is provided. The oxynitride layer may be formed by a growing method performed in a furnace under a NO, $N_2O$, or $NH_3$ gas atmosphere, or by a plasma enhanced chemical vapor deposition (PECVD) method.

The PECVD method is disadvantageous in that it increases production costs due to the need to purchase PECVD equipment. The growing method performed in a furnace is also disadvantageous in that it increases the process/fabrication time, because an oxide layer is formed and then an oxynitride layer is formed by thermally treating the oxide layer under a nitrogen gas atmosphere. Further, the method for growing the oxynitride layer in a furnace is disadvantageous in that it further increases production cost, since an apparatus for implanting nitrogen gas, an apparatus for neutralizing harmful gas, and a plurality of stabilization apparatus are required to grow the oxynitride layer in a furnace.

Figure 1:
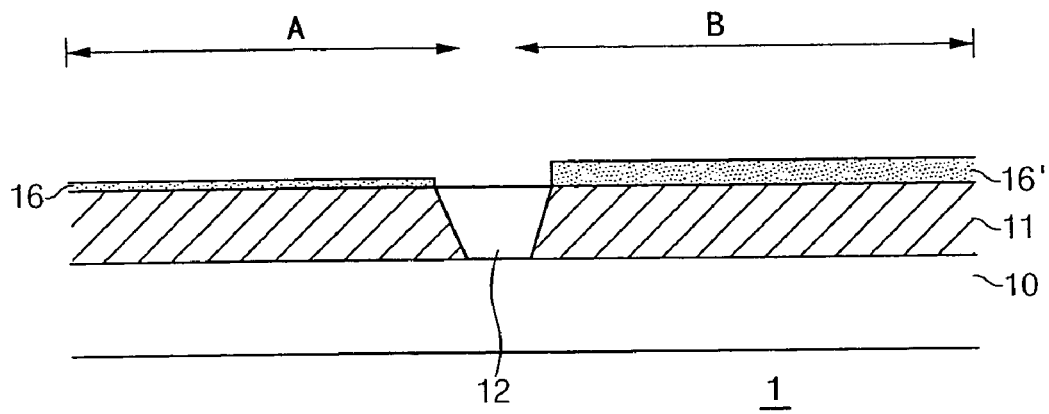
FIG. 1 is a schematic cross-sectional view of an example semiconductor device constructed in accordance with the teachings of the present invention.

To clarify multiple layers and regions, the thickness of the layers are enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

In the example of FIG. 1, an example semiconductor device 1 includes a Si substrate 10, a plurality of active regions 11 formed in the Si substrate 10, and a device isolation region 12 separating the active regions 11.

The device isolation region 12 may be formed by a shallow trench isolation (STI) method or a local oxidation of silicon (LOCOS) method. In the illustrated example, the active region 11 is formed by implanting boron as a P-type impurity into the Si substrate 10. In order for one substrate to realize multiple device characteristics, a first region A and a second region B are designated. Each of the first region A and the second region B has an insulating layer (e.g., an oxynitride layer). The insulating layer in region A is formed with a different thickness than the insulating layer in region B.

As a result, different operating voltages may be applied to the first region A and the second region B. For instance, the operating voltage of the first region A may be lower than that of the second region B. To this end, the first region A and the second region B respectively have a first oxynitride layer 16 and a second oxynitride layer 16' that are of different thicknesses. In the illustrated example, the first oxynitride 16 has a thinner thickness than the second oxynitride 16'.

An example method for manufacturing a semiconductor device will now be described with reference to the accompanying drawings.

Figure 2A:
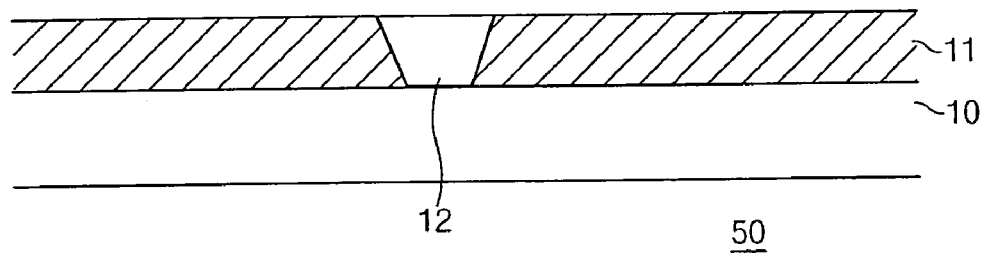
FIG. 2A to FIG. 2C are cross-sectional views illustrating an example method of manufacturing an example semiconductor device performed in accordance with the teachings of the present invention.
Figure 2B:
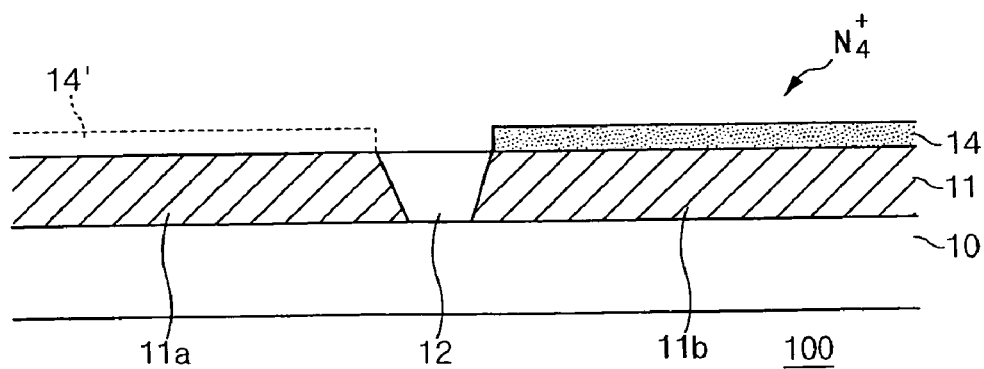
Figure 2C:
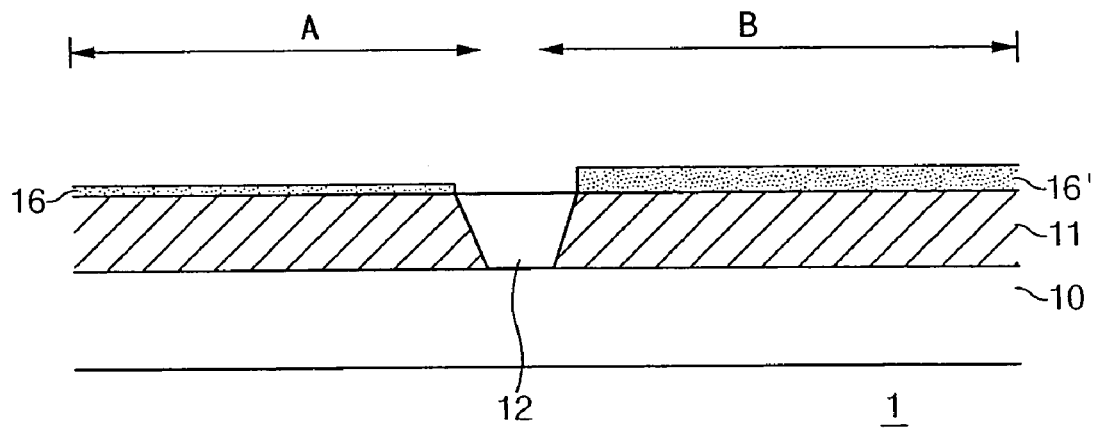
Figure 3:
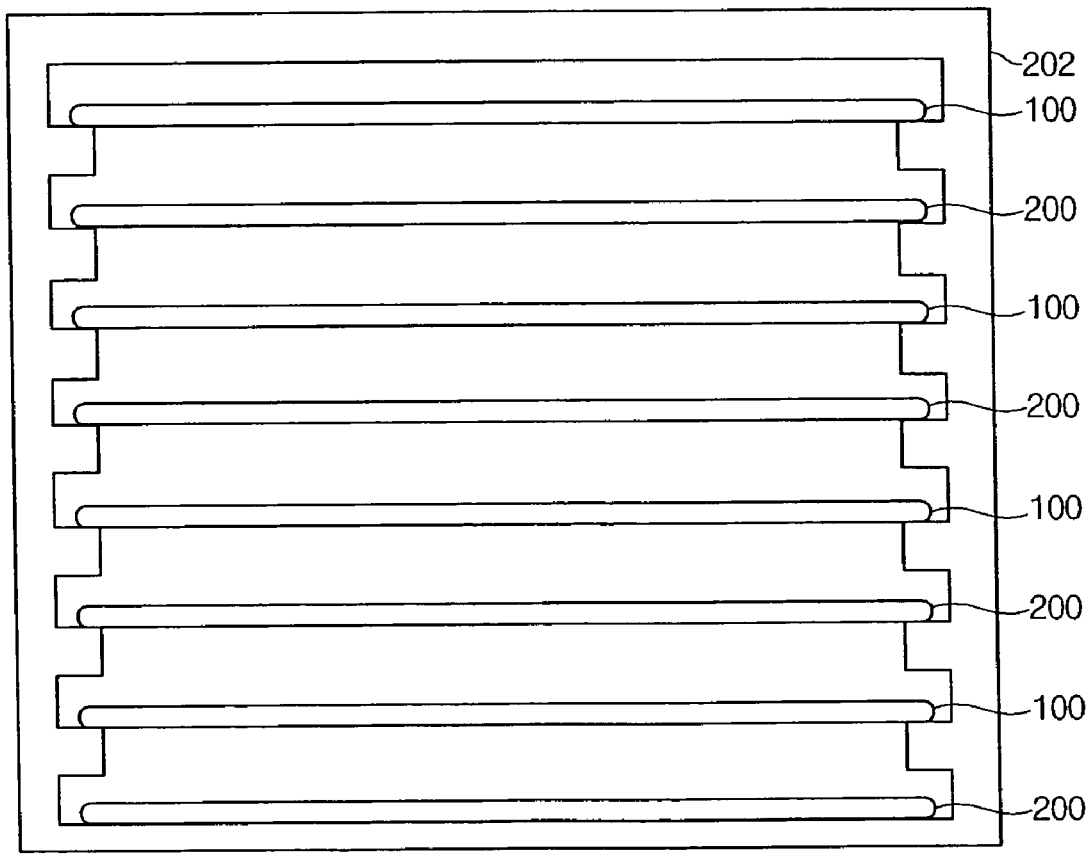
FIG. 3 is a schematic cross-sectional view of a boat mounted with substrates which may be used in the example method of FIGS. 2A-2C.

FIG. 2A to FIG. 2C are cross-sectional views illustrating an example method of manufacturing a semiconductor device performed in accordance with the teachings of the present invention. FIG. 3 is a schematic cross-sectional view of a boat loaded with substrates used in the method of FIG. 2.

FIG. 2A is a schematic, cross-sectional view of an example semiconductor device 50 without an oxynitride layer.

As shown in FIG. 2A, a device isolation region 12 is formed in a predetermined position of the Si substrate by an STI or LOCOS method to divide an active region 11.

Then, ions for controlling a P-type threshold voltage (Vth), ions for fixing a channel, ions for forming a well, and ions for avoiding a punch-through are implanted into the active region(s). As a result, a PMOS is formed. The order of forming the active region(s) 11 and the device isolation region 12 can be varied, as will be evident to persons of ordinary skill in the art.

FIG. 2B is a schematic, cross-sectional view of an example semiconductor device 100 with an oxynitride layer formed only on the first active area 11a so as to form the first oxynitride layer and second oxynitride layer to have different thicknesses. It is to be understood that the semiconductor device 100 shows the semiconductor device 50 at a later production stage.

As noted above, when the insulating layers are formed to have different thicknesses on the same semiconductor device, the same semiconductor device can realize different device characteristics. With such a structure, for example, a P-type gate may have a dual gate characteristic.

As such, in order to form the insulating layers with different thicknesses, a first oxide layer 14 may be formed on the active region 11 by a thermal oxidation process. Herein, the first oxide layer 14 is defined to have a uniform crystalline structure and to be formed once.

The first oxide layer 14 is provided to enable formation of the different insulation layers in the first region A and the second region B. Since, due to the first oxide layer 14, the first region A and the second region B respectively have the first oxynitride layer 16 and the second oxynitride 16' of different thicknesses, the first region A and the second region B may be operated at different operating voltages. The first oxide layer (see 14' defined by the dotted line in FIG. 2B) is removed from one active region 11a (e.g., the first region A). The first oxide layer 14 remains on the other active region 11b (e.g., on the second region B).

FIG. 2C is a schematic cross-sectional view of an example semiconductor device 1 with the first oxynitride layer 16 and the second oxynitride layer 16'. (It should be understood that the semiconductor device 1 illustrates the semiconductor device 100 at a later stage of fabrication). When semiconductor device substrate 100 (hereinafter called the first substrate) such as those shown in FIG. 2 are loaded into the boat of FIG. 3 and oxidized in a furnace, the first oxynitride layer 16 and the second oxynitride layer 16' are formed to have different thicknesses, thereby completing the semiconductor device 1. Since the semiconductor device 1 has the first region A and the second region B, different regions of the device 1 can be operated at different operating voltages.

An example method of manufacturing the first and the second oxynitride layers (16, 16') will now be described in detail with reference to FIG. 3. First, one or more first substrates 100 and one or more second substrates 200 are prepared. First oxide layers 14 are selectively formed on one active region 11b of each of the first substrates 100, and at the same time, nitride layers are formed on the surfaces of each of the second substrates 200. The first and second substrates 100 and 200 are alternately loaded into the slots of a boat 202 to be mounted in the furnace.

When the boat 202 carrying the substrates 100, 200 is mounted in the furnace, the first substrate 100 and the second substrate 200 are oxidized by a heat treatment under an oxygen atmosphere.

In this example, the first substrate may be differentially oxidized depending on the first oxide layer 14.

The second substrate 200 may also be oxidized. In detail, when the Si is separated from the nitride layer (i.e., $Si_3N_4$ film) and oxygen gas is injected into the furnace, the Si reacts with the oxygen gas to form an oxide layer on the second substrate 200 and nitrogen radicals are separated from the nitride layer.

The nitrogen radicals have good reactivity. Accordingly, the nitrogen radicals have an effect on the oxidation of the first substrate 100. In more detail, since Si is fixed in the active region 11a, the nitrogen radicals are subject to reaction with free oxygen. Accordingly, the nitrogen radicals are combined with the free oxygen to directly form the first oxynitride layer 16 on the active region 11a. Also, the nitrogen radicals are attached to the first (or original) oxide layer 14 to form the second oxynitride layer 16'. In this example, the first oxynitride layer 16 is formed on the active region 11a to form the first region A and the second oxynitride layer 16' is formed on the first oxide layer 14 to form the second region B.

It has been experimentally determined that, when the first substrate 100 is loaded in the furnace and is oxidized along with the second substrate 200 having the nitride layer, the oxide layer (i.e., the first oxynitride 16) is grown to be thinner. It is believed that the nitrogen radicals are separated from the nitride layer and, thus, have an effect on the oxidation of the first substrate.

Accordingly, the first oxynitride layer 16 has a thinner thickness and has a uniform crystalline structure. Meanwhile, the second oxynitride layer 16' has approximately the same thickness as the first oxide layer 14 regardless of the nitrogen radicals. The second oxynitride layer 16' has a high concentration of the nitrogen radicals at the surface thereof, and the concentration of the nitrogen radicals decreases along a depth direction proceeding away from the surface. Accordingly, the second oxynitride layer 16' has a non-uniform crystalline structure in comparison with the first oxynitride layer 16.

The first oxide layer may not be formed on the active region 11. As a result, only one oxynitride layer may be formed on the active region 11 without using the harmful nitrogen gas.

In some examples, when the first substrate 100 is oxidized along with the second substrate 200 having the nitride layer, the oxynitride layer can be easily formed without an additional process.

Since the example method does not use harmful NO, $N_2O$ gas and/or the like, the oxynitride layer can be safely formed.

From the foregoing, persons of ordinary skill in the art will appreciate that semiconductor devices and method of manufacturing the same have been provided wherein an oxynitride layer can be easily formed without reforming a conventional furnace or using harmful NO, $N_2O$ gas and/or the like.

An example method of manufacturing a semiconductor device disclosed herein includes loading first and second substrates together into a boat, wherein the first substrate is to be formed with an oxynitride layer and the second substrate has been formed with a nitride layer, and thereafter forming the oxynitride layer on the first substrate by placing the boat into a furnace and thermally treating the boat in an oxygen atmosphere.

The nitride layer may be formed on the surface of the first substrate.

The first and the second substrates may be alternately loaded in a plurality of slots of the boat.

An oxide layer may be selectively formed on only a predetermined area of the first substrate before loading the first and the second substrates. (In other words, one or more areas of the first substrate might not include the oxide layer).

An example semiconductor device disclosed herein includes a silicon substrate, a plurality of active regions formed in the silicon substrate and a device isolation region to separate the active regions, wherein the active regions contain a small amount of boron; and the active regions are divided into a first region and a second region, the first region having a first oxynitride layer and the second region having a secondary oxynitride layer.

The first oxynitride layer may have a thinner thickness than the second oxynitride layer.

The first oxynitride layer may have a more uniform crystalline structure than the second oxynitride layer.

The second oxynitride layer may have a decreased concentration of nitrogen along a depth direction of the second oxynitride layer.

The first and the second oxynitride layers may have no annealed fine crystalline structure.

The first oxynitride layer may have a thinner thickness and a more uniform crystalline structure than the second oxynitride layer.

The second oxynitride layer may have approximately the same thickness as that of the first oxide layer and a concentration of nitrogen decreased along a depth direction of the second oxynitride layer.

The first oxynitride layer may have a thinner thickness than the second oxynitride layer, and the second oxynitride layer may have approximately the same thickness as the first oxide layer.

The first oxynitride layer may have a uniform crystalline structure and the second oxynitride layer may have a concentration of nitrogen which decreases along a depth direction of the second oxynitride layer.

This application claims priority from Korean Patent Application 10-2004-0059206 which was filed in the Korean Intellectual Property Office on Jul. 28, 2004. The entire content of Korean Patent Application 10-2004-0059206 is incorporated herein by reference.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method to manufacture a semiconductor device, comprising:
   selectively forming an oxide layer on only a predetermined portion of a first substrate before loading the first substrate and a second substrate into a boat;
   loading the first and the second substrates alternately in a plurality of slots of the boat, wherein the first substrate is to be provided with an oxynitride layer and the second substrate has a nitride layer; and
   forming the oxynitride layer on the first substrate by positioning the boat in a furnace and thermally treating the boat in an oxygen atmosphere.

2. A method as defined in claim 1, wherein the nitride layer is on the surface of the second substrate.

3. A method as defined in claim 1, further comprising selectively forming an oxide layer on a first predetermined position of the first substrate while not forming an oxide layer on a second predetermined portion of the first substrate before loading the first and the second substrates.

4. A method as defined in claim 1, wherein the oxynitride layer is formed on the first substrate without adding a nitrogen-containing gas to the furnace.

5. A method as defined in claim 1, further comprising forming a pluiality of active regions in the first substrate prior to selectively forming the oxide layer.

6. A method as defined in claim 5, further comprising forming device isolation regions separating each of the plurality of active regions.

7. A method as defined in claim 5, wherein selectively forming the oxide layer on only the predetermined portion of the first substrate comprises thermally oxidizing the plurality of active regions to form the oxide layer over the plurality of active regions, and removing the oxide layer from all of the plurality of active regions except in the predetermined portion of the first substrate.

8. A method as defined in claim 5, wherein the predetermined portion of the first substrate comprises one of the plurality of active regions.

9. A method as defined in claim 8, wherein forming the oxynitride layer on the first substrate comprises forming a first oxynitride layer over the predetermined portion and forming a second oxynitride layer on at least one of the remaining active regions of the plurality of active regions.

10. A method as defined in claim 8, wherein the first oxynitride layer has a thickness greater than a thickness of the second oxynitride layer.

11. A method as defined in claim 8, wherein the first oxynitride layer has a thickness substantially equal to the thickness of the oxide layer.

12. A method as defined in claim 10, wherein the second oxynitride layer has a crystalline structure with a substantially uniform distribution of nitrogen.

13. A method as defined in claim 10, wherein the first oxynitride layer has a crystalline structure and a concentration of nitrogen that decreases from a surface of the oxynitride layer to an interface of the oxynitride layer with the underlying predetermined portion of the first substrate.

14. A method as defined in claim 1, wherein the first and second substrates comprise silicon.

15. A method as defined in claim 5, wherein forming the plurality of active regions comprises:
   implanting P-type ions into the first substrate to control a threshold voltage;
   implanting ions into the first substrate to fix a channel; and
   implanting ions into the first substrate to prevent a punch-through effect.

16. A method as defined in claim 1, wherein thermally treating the boat in the oxygen atmosphere comprises flowing a gas mixture substantially free of nitrogen into the furnace.

17. A method as defined in claim 6, wherein forming the device isolation regions comprise a LOCOS or a shallow trench isolation method.

* * * * *